(12) United States Patent
Robbins et al.

(10) Patent No.: US 8,049,880 B2
(45) Date of Patent: Nov. 1, 2011

(54) SYSTEM AND METHOD FOR TIME RESOLVED SPECTROSCOPY

(75) Inventors: Mark Stanford Robbins, Brentwood (GB); Raymond Thomas Bell, Stanmore (GB)

(73) Assignee: E2V Technologies (UK) Limited, Chelmsford Essex (GB)

( * ) Notice: Subject to any disclaimer, the term of this patent is extended or adjusted under 35 U.S.C. 154(b) by 383 days.

(21) Appl. No.: 11/505,490

(22) Filed: Aug. 17, 2006

(65) Prior Publication Data
US 2007/0041017 A1 Feb. 22, 2007

(30) Foreign Application Priority Data
Aug. 18, 2005 (GB) .................. 0516989.1

(51) Int. Cl.
*G01J 3/00* (2006.01)
(52) U.S. Cl. ........................................ 356/300
(58) Field of Classification Search ............ 356/300, 356/451; 250/226, 208.1–208.06
See application file for complete search history.

(56) References Cited

U.S. PATENT DOCUMENTS

| | | | |
|---|---|---|---|
| 5,173,748 A | 12/1992 | Bilhorn | |
| 6,175,126 B1 | 1/2001 | West | |
| 6,444,968 B1 | 9/2002 | Burt et al. | |
| 6,596,979 B2 * | 7/2003 | Hou | 250/208.1 |
| 7,078,670 B2 * | 7/2006 | Atlas et al. | 250/208.1 |
| 2005/0056771 A1 | 3/2005 | Atlas et al. | |
| 2005/0092943 A1 | 5/2005 | Nitsche et al. | |
| 2006/0081769 A1 | 4/2006 | SeyFried et al. | |

FOREIGN PATENT DOCUMENTS

| | | |
|---|---|---|
| EP | 0 866 501 A1 | 9/1998 |
| EP | 1 528 412 A1 | 5/2005 |
| EP | 1 803 157 A0 | 4/2006 |
| EP | 1 688 960 A2 | 8/2006 |
| EP | 1 708 271 A1 | 10/2006 |
| GB | 2 371 403 A | 7/2002 |
| WO | WO 2005/013605 A1 | 2/2005 |

OTHER PUBLICATIONS

Robbins, Mark Stanford, et al., "The Noise Performance of Electron Multiplying Charge-Coupled Devices," *IEEE Transactions on Electronic Devices*, vol. 50, No. 5, pp. 1227-1232, May 2003.
UK Search Report, dated Dec. 23, 2005, issued for counterpart Application No. GB 0516989.1.
European Patent Office Search Report, dated Aug. 9, 2007, issued for counterpart Application No. EP 06254250.

* cited by examiner

*Primary Examiner* — Tarifur Chowdhury
*Assistant Examiner* — Abdullahi Nur
(74) *Attorney, Agent, or Firm* — Venable LLP; Robert Kinberg; Robert S. Babayi

(57) ABSTRACT

A system for time resolved spectroscopy comprises a CCD device arranged to receive a time varying spectrum. Time resolved spectroscopy is the analysis of a spectrum that varies with time due to any cause. The variation with time of the spectrum may be due, for example, to (i) changes of the spectrum from a given sample space with time (such as due to emission decay); and (ii) changes in the spectrum as successive portions of a sample space are sampled (such as laser scanning microscopy). The CCD device comprises an array of photosites arranged to detect the time varying spectrum and to produce signal charge representative of the spectrum, and one or more CCD multiplication registers arranged to receive the signal charge and to provide charge multiplication. An enhancement of speed and sensitivity is given by a storage area which receives the signal charge in parallel from the array of photosites to provide the charge in serial to the one or more multiplication registers.

21 Claims, 5 Drawing Sheets

SYSTEM AND METHOD FOR TIME RESOLVED SPECTROSCOPY

CROSS-REFERENCE TO RELATED APPLICATIONS

This application claims priority from Application No. GB 0516989.1 filed Aug. 18, 2005 in the United Kingdom.

FIELD OF THE INVENTION

The present invention relates to CCD devices, in particular to CCD devices for use in time resolved spectroscopy devices.

BACKGROUND OF THE INVENTION

The concept behind fluorescence microscopy is as follows. Fluorescent dye molecules can be attached to specific parts of the biological sample of interest. When excited by a suitable wavelength of light these markers fluoresce so that only those parts are seen in the microscope. More than one type of fluorescent dye can be used in the sample to attach to different features. By changing the wavelength of the excitation light, different types of dye can be forced to fluoresce thus enabling different structures within the sample to be distinguished. The dyes can be chosen to fluoresce at different wavelengths. Thus if the sample is excited by a spectrum of light the colour (or wavelength) of the fluorescence will give information as to the structure. In laser scanning microscopy, for example, a laser will scan the sample and the fluorescence observed by a suitable detector. A schematic representation of such a system is shown in FIG. 1.

The laser scanning microscopy device of FIG. 1 comprises a laser 10 arranged to illuminate a sample 12 via a dichroic mirror and two scanning mirrors 16, 18. The scanning mirrors cause the laser beam to scan the surface of the sample 12. Imaging optics 20 are arranged so that the scanning spot of light in the sample is imaged onto a pin hole 22. This arrangement is referred to as a confocal arrangement and ensures that only fluorescence from a particular spot being scanned reaches a detector 24. Any light from a depth within the sample that is not at the focus of the optics will not be focussed exactly on the pin hole (it will form an Airy ring larger than the pin hole) and so will not pass to the detector 24. The confocal arrangement thus allows different portions of a sample to be sampled over time (as the beam scans) and so this is a form of time resolved spectroscopy.

Multiple lasers 10 at different wavelengths can also be used to scan the sample and the spectrum of the fluorescence can be sampled. A picture of the distribution of the fluorescent markers, and thus the structure can thus be constructed. This is illustrated in FIG. 2. Like components are given the same reference numerals as FIG. 1 and the description will not be repeated here. A prism or diffraction grating 26 splits the spectrum of wavelengths from the sample across a plurality of sensors 28. This allows the spectral response of the sample at different wavelengths to be simultaneously sampled.

The way the fluorescent spectrum is split between the detectors is determined by the prism/diffraction-grating configuration. This is chosen to separate out the markers of interest or to sample the spectrum of light from one marker for example. The current state of the art utilises a small number of discrete detectors (e.g. 4), each sampling a range of wavelengths. The detectors currently employed are typically photomultiplier tubes or avalanche photo diode devices. There is currently a need to take a more complete sample of the emitted spectrum in order, for example, to simplify the optics, and to present more information to the operator so that a flexible use of optical filters can be applied in software once the data has been acquired. Ideally a detector that can sample the spectrum simultaneously at wavelengths between 300 and 900 nm and a resolution of, say 10 nm would be useful. Typical requirements are for the sample to be scanned to produce an image with a resolution of 512×512 pixels at a rate in the order of 5 images per second. This implies that a full spectra will need to be acquired at a rate of about 1,300,000 spectra per second; that is one spectra needs to be acquired every 0.8 micro seconds. In practice the required rate of spectra acquisition will be higher than this as a fraction of the scanning time will be required for the change in the direction of the scan, for example.

For conventional non-scanning digital spectral detection, for example those used within spectrometer systems, linear or area array charge coupled (CCDs) are employed to image the spectrum dispersed by a diffraction grating. In general these systems have poor temporal resolution. The spectrum is distributed across the imaging area and the resultant electrons generated by the incident photons are collected within the pixels during the integration time. The signal is then read out of the devices via a readout register and on-chip charge to voltage conversion amplifiers. Various modes of operation can be employed, for example full vertical binning can be used. A CCD architecture can be used that enables the so-called "kinetic mode" of operation. This architecture is illustrated in FIG. 3. Here an area array 36 is completely masked off from the incident light except for a small number of lines 32 (typically one) at the top of the device. Spectra, once obtained, can be clocked rapidly into the storage region 36 of the device and then to an output amplifier 30. Thus spectra with good temporal resolution can be gathered. However, once the storage region is filled it has to be readout serially via the readout register. This is a much slower process than the transfer into the store and would not meet the timing requirement of the laser scanning system. More importantly, a system based on a conventional CCD or CMOS device will not have the required sensitivity. This is determined by the need to reduce the illumination incident on the sample to the minimum to avoid bleaching effects and sample damage.

SUMMARY OF THE INVENTION

We have appreciated the need for an improved detector arrangement for time resolved spectroscopy devices. In particular, we have appreciated the need for increased speed of sampling and sensitivity.

The invention is defined in the claims to which reference is now directed.

The embodiment of the invention utilises electron multiplication and novel device architecture and mode of operation to provide the desired sensitivity and temporal resolution for use within systems such as laser scanning microscopy.

BRIEF DESCRIPTION OF THE FIGURES

An embodiment of the invention in the various aspects noted above will now be described with reference to the figures in which.

DESCRIPTION OF EMBODIMENTS OF THE INVENTION

The embodiments of the invention described are in the form of CCD devices of the type suitable for time resolved spectroscopy, and also spectroscopy systems including such devices. To avoid repetition, it is noted that the CCD devices, as will now be described in relation to FIGS. 4 to 9, may be used in the microscopy system, shown in FIG. 2, to provide a system embodying the invention. It is noted, for the avoidance of doubt, that not all CCD devices are suitable for time resolved spectroscopy as will now be explained. Time resolved spectroscopy is the analysis of a spectrum that varies with time due to any cause. The variation with time of the spectrum may be due, for example, to (i) changes of the spectrum from a given sample space with time (such as due to emission decay); and (ii) changes in the spectrum as successive portions of a sample space are sampled (such as laser scanning microscopy).

Figure 1:
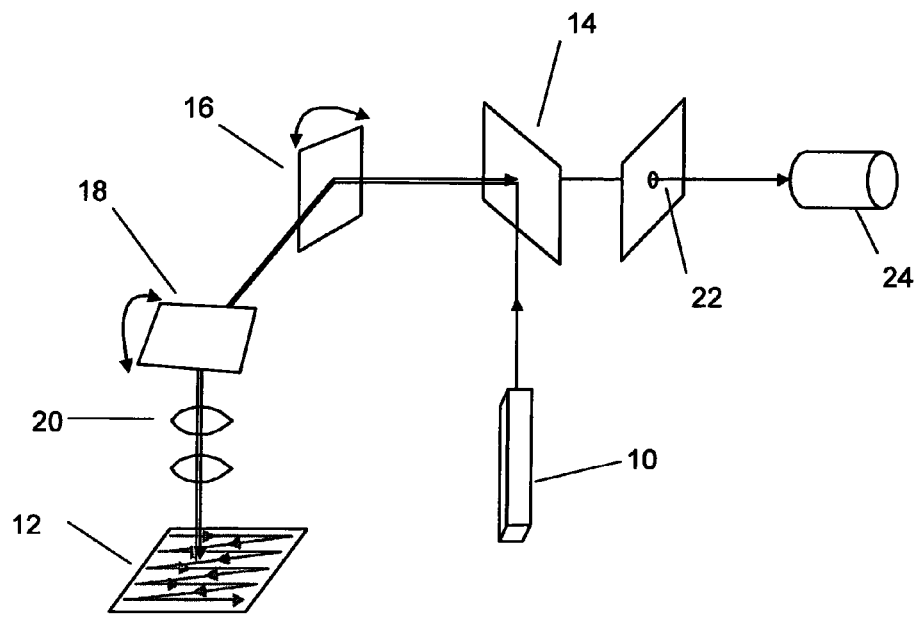
FIG. 1: is a block diagram of a known laser scanning microscopy device.
Figure 2:
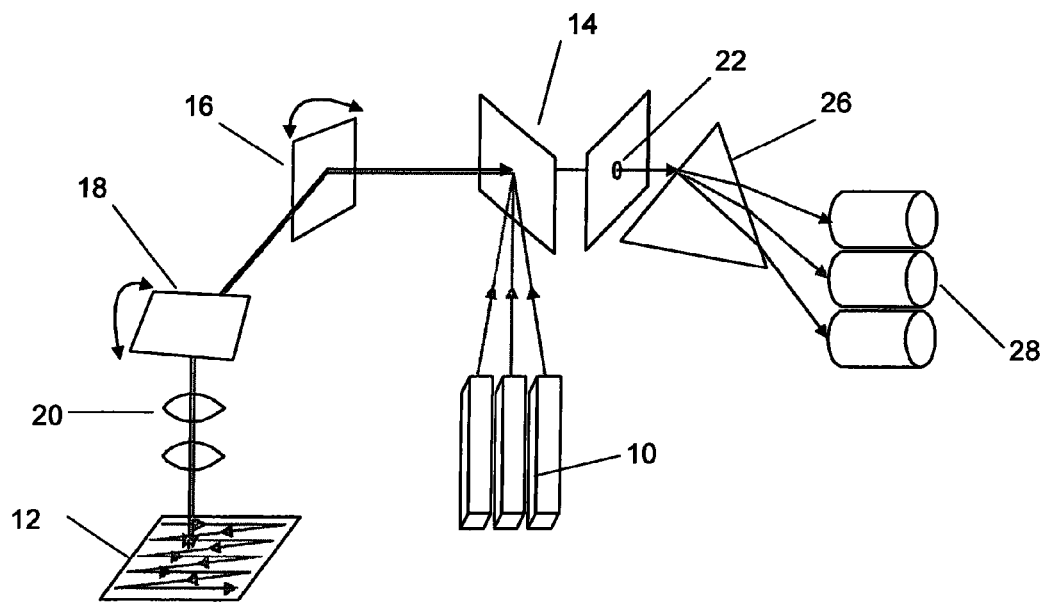
FIG. 2: is a block diagram of the device of FIG. 1 with multiple detectors.

As shown in FIG. 2, when embodying the invention, a target sample is scanned with a laser beam (or multiple beams) line by line, with 500 samples being taken per line. This means that during a scan of one line 500 different spectra are sampled and need to be processed. If the number of scan lines is also 500, then the total number of spectra to be sampled and processed for a complete scan is 500×500=250,000. The embodiment needs to accommodate this rate without worsening signal noise.

Figure 3:
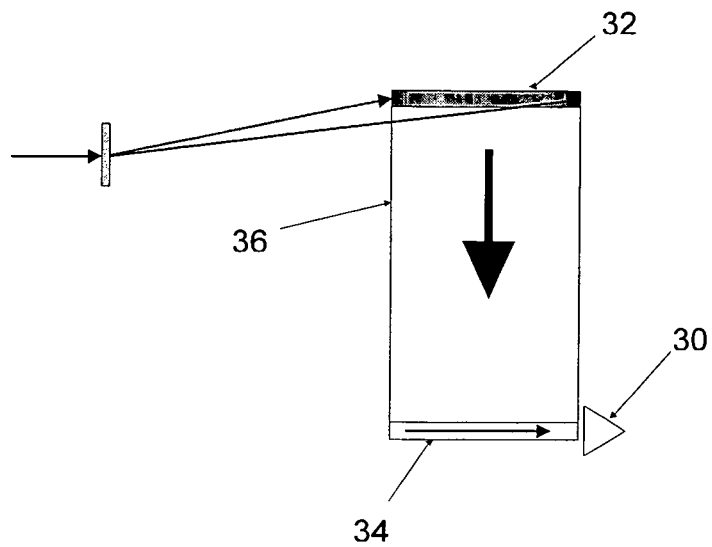
FIG. 3: is a known CCD sensor.
Figure 4:
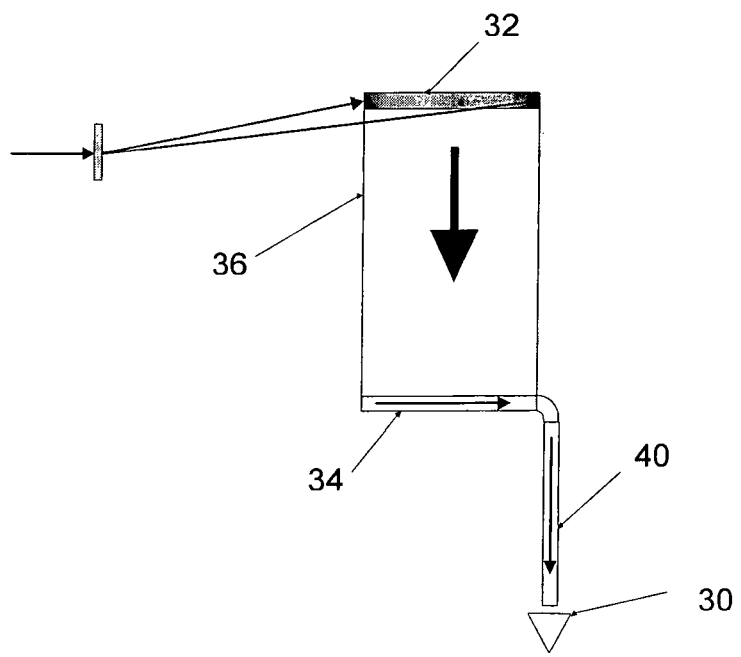
FIG. 4: is a CCD sensor according to a first embodiment of the invention, which may be used, with the device of FIG. 1 or 2.

A first CCD device embodying the invention is shown in FIG. 4. The device comprises an array of photosensitive sites 32, a CCD storage area 36 arranged to have 500 lines (to match the number of samples per line), a readout register 34 and an amplifier 30 similar to the known device of FIG. 3. In addition, a multiplication register 40 is provided between the output of the register 34 and the amplifier 30. The array of photosites is typically a CCD array, but could be other technologies such as photodiodes.

The multiplication register comprises an array of clocked elements each comprising sequence electrodes, at least one of which provides a high voltage to provide charge amplification by impact ionisation. A typical voltage is 30 to 40 volts and such arrangements are described in published literature.

The basis of the first embodiment uses the "kinetic mode" concept. The mode of operation is as follows. As the scanning system scans across the sample, spectra are collected and stored within the storage region (e.g. 500 spectra). At the end of the line (i.e. when the laser reaches the boundary of the sample) the storage region is readout through the readout register and the multiplication register. The multiplication register provides almost noiseless gain within the charge domain thus allowing single photons to be detected. The readout of the store occurs as the laser returns to the beginning of the next line to be scanned.

If it is required that the whole target be sampled twice per second (500 spectra per line and 500 lines) and that half of the time is used to reposition the scanning laser from the end of a line to the beginning of the next, then this implies a time available to acquire one spectra is 1 microsecond. By the time the scan reaches the end of each line 500 spectra will have been transferred to the store. When the scan reaches the end of the line readout of the store can begin and continue until the scanning of the next line commences. In the embodiment discussed here a time of 0.5 milliseconds is available to readout the store. If say 100 photosites are used in the photosensitive array of photosites 32, 500×100 elements will need to be readout of the store in 0.5 milliseconds giving a total data rate of 100 MHz.

Figure 5:
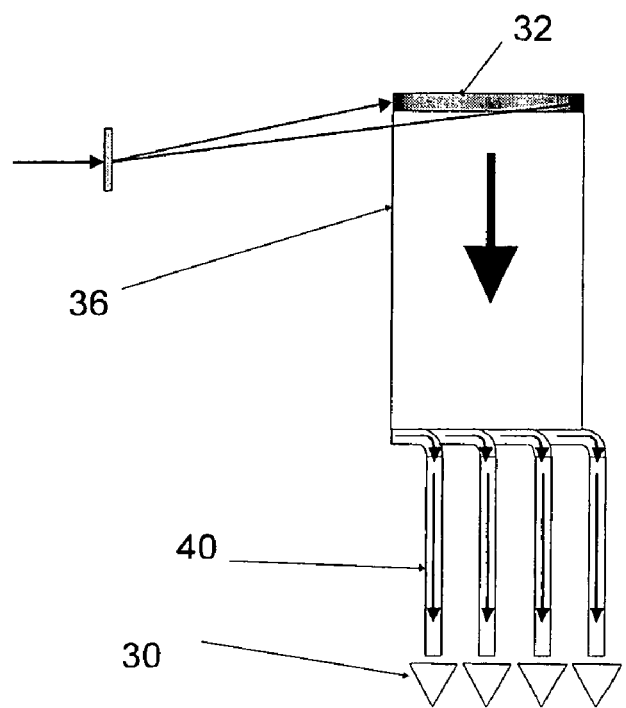
FIG. 5: is a CCD device according to a second embodiment of the invention, which may be used, with the device of FIG. 1 or 2.
Figure 6:
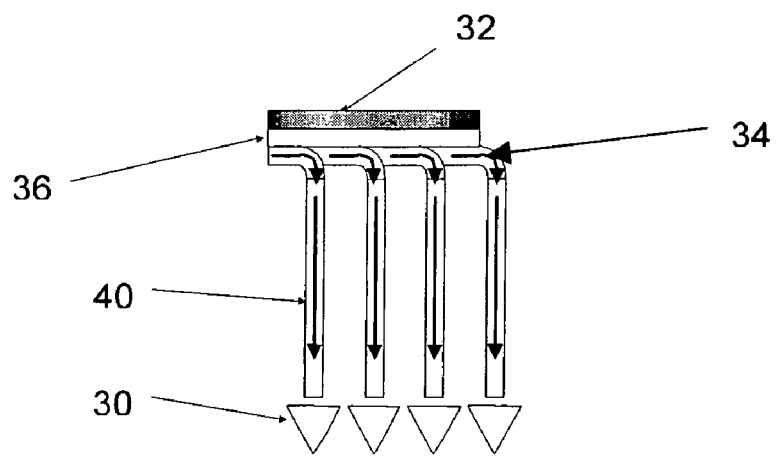
FIG. 6: is a CCD device according to a third embodiment of the invention, which may be used with the device of FIG. 1 or 2.

In order to minimise the data rate per output, multiple multiplication registers and outputs can be employed, as in the case illustrated in the second embodiment of FIG. 5, which shows four multiplication registers and output amplifiers. In practice any number of registers can be employed. The output from the device may be simplified by the use of a multiplexer to recombine the outputs. With four multiplication registers, as shown, each multiplication register multiplies charge for a portion of the total photosites (and hence a portion of the total spectrum), in this case a quarter each. So, each multiplication register now only needs to be clocked at a quarter of the clocking speed of the arrangement of FIG. 4, namely 100 MHz÷4=25 MHz. This is a realistic and achievable speed with the result that the signal may be processed in the time available.

We have appreciated that the use of the store in FIG. 5 can be applied if there will be a time when spectra is not collected. For example, when the laser repositions from the end of one line to the beginning of the next. This time may not always be available. Therefore the following architecture and mode of operation is proposed in relation to a third embodiment shown in FIG. 6. The proposed device consists of an optically sensitive region 32 (made up of a small number of rows, typically one, and a number of columns, typically 96), an optically opaque region 36 into which the signal from the gathered spectra is transferred (this region may be omitted), a number of readout registers 34 and the same number of multiplication registers 40 and charge to voltage output amplifiers 30 (typically 8). A typical number of elements in each readout register is 12 and the typical number of elements in the multiplication register is 500-600. The multiplication registers are clocked at a pixel rate of 14 MHz (for example). The readout clocks can be held at a static level whilst the signal from the spectrum is being integrated. One or more phases of the readout register are then held high ready to accept signal from the optically sensitive region (or from the store if present). The signal is rapidly clocked down into the readout register and the readout clocks start at the same rate as the multiplication register clocks in order to transfer the number of pixels in each readout register (typically 12) into the multiplication register. Once this is complete the readout register clocks are stopped and the cycle continues. This enables a high collection rate of spectra with limited dead time. In effect, the spectra are detected, signal charge multiplied and processed at the same rate as the sample is scanned. The store 36 could, therefore, be omitted because the charge is clocked out of the photosensitive region 32 and processed as fast as it is sampled. Typically a store of at least one line will be used, however, as this allows charge to be integrated in the photosensitive array whilst the previously integrated charge is clocked out of the one line store 36. Assuming it takes 2 clock cycles to transfer signal into the readout register one spectra can be obtained every 1 microsecond if the typical values are employed. It should be noted that more than one spectrum will be held within each multiplication register before the first spectra emerges. For example if there are 600 multiplication elements 50 spectra will be acquired before the first spectra is output from the device.

Figure 7:
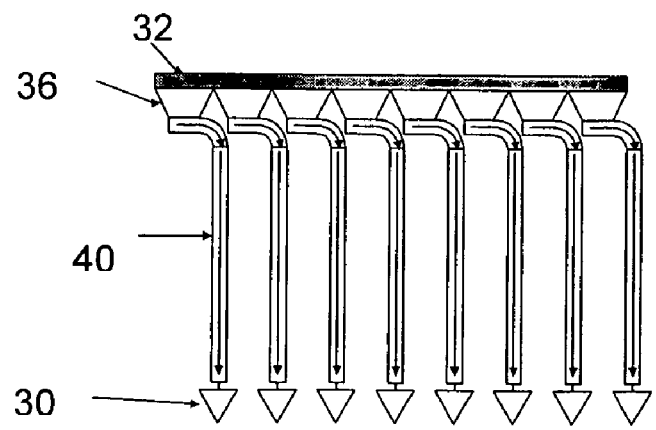
FIG. 7: is a CCD device according to a fourth embodiment of the invention, which may be used, with the device of FIG. 1 or 2.
Figure 8:
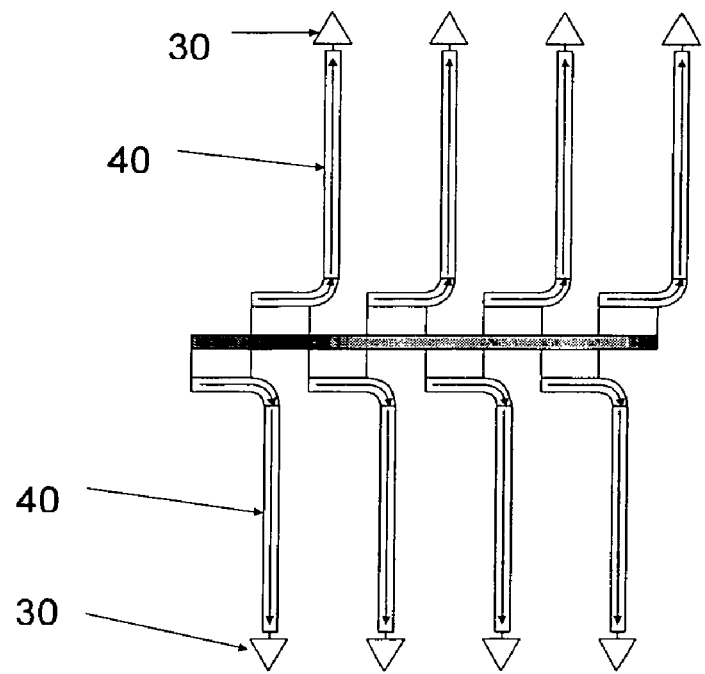
FIG. 8: is a CCD device according to a fifth embodiment of the invention, which may be used, with the device of FIG. 1 or 2.
Figure 9:
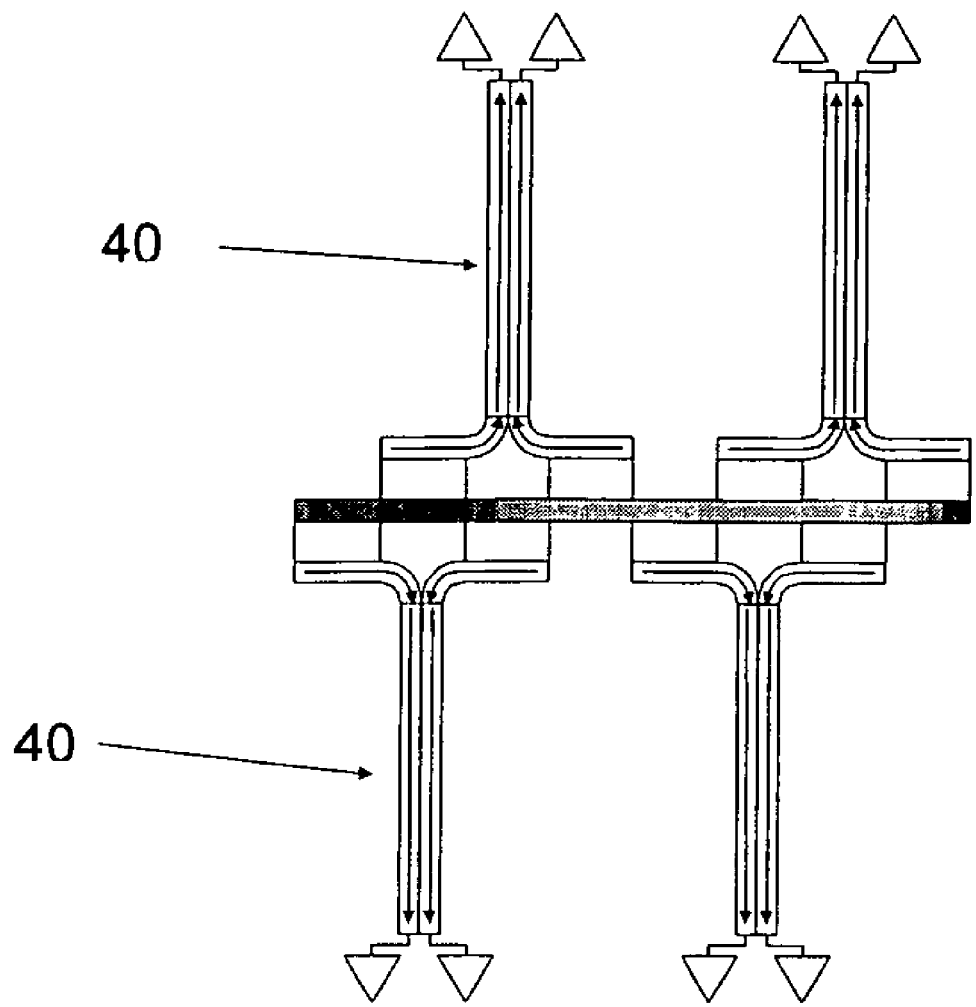
FIG. 9: is a CCD device according to a sixth embodiment of the invention, which may be used, with the device of FIG. 1 or 2

Some practical problems in implementing multiple charge multiplication registers have been appreciated and are addressed in the embodiments of FIGS. 7, 8 and 9.

One of the main design limits stems from the need to have a bond pads and electrical connections between the multiplication registers. In order to make the necessary electrical contact to the registers and output amplifiers sufficient space must be made available. As shown in FIG. 7, space is limited with 8 multiplication registers. An embodiment allowing more space for the bond pads and tracking is shown in FIG. 8. The alternate clocking direction of the charge from the imaging section can be achieved through the appropriate use of implants for example.

The layout can be improved upon further using the arrangement of FIG. 9. Here pairs of registers are close together, improving the tracking possibilities and improving the gain matching between those multiplication registers that are close together.

The number of outputs influences the spectral sampling rate. At least eight outputs are required to sample 96 spectral bins at 1 μs. 12 spectral bins will be handled by each output. At least two clock periods are required to parallel transfer the signal into the readout register. This leads to a pixel rate of (12+2)/1 μs=14 MHz per output.

Around 600 elements are typically used within each multiplication register of the embodiments to provide sufficient gain. Therefore, in the embodiment of FIG. 9, about 50 spectral samples will be acquired before the first emerges from the multiplication register. The system is arranged with synchronisation of the clocks to ensure that there is no clocking activity when the output is sampled to avoid the output being corrupted by clock feed-through. The gain provided by the multiplication registers is typically of the order 1000.

In the embodiments described, the photosensitive array of photosites is preferably a CCD array (whether a single line or multiple lines). However, a different technology such as photodiodes could be used for charge gathering and the multiplication. register (CCD) used for multiplication.

In the embodiments in which multiple multiplication registers are used, each processing charge accumulated from different parts of the spectrum analysed, the characteristics of the multiplication registers can be designed so as to provide appropriate multiplication for each spectral portion.

As previously noted, multiple rows of photosites may be used and in this case the charge integrated in a given sampling time in each row is summed into a store or readout register. Any number of rows may do so depending on the size of the photosites. The array effectively acts as a line array as each column receives light from the same part of the spectrum. The purpose of having multiple rows is to provide improved charge capture.

The embodiments described are in relation to laser-scanned microscopy, but could apply equally to other types of time resolved spectroscopy such as used in many disciplines from life sciences to combustion chemistry.

What is claimed is:

1. A system for time resolved spectroscopy comprising a CCD device arranged to receive a time varying spectrum, the CCD device comprising:
    an array of photosites arranged to detect the time varying spectrum and to produce signal charge representative of the spectrum,
    a storage region arranged to receive the signal charge from the array of photosites,
    a plurality of readout registers arranged to receive charge from the storage area, and
    the same number of CCD multiplication registers as the plurality of readout registers each arranged to receive the signal charge from a respective one of the readout registers and to provide charge multiplication, each multiplication register being arranged to receive signal charge from a respective portion of the array of photosites corresponding to a given portion of the spectrum of wavelengths.

2. A system according to claim 1, wherein the storage area receives the signal charge in parallel from the array of photosites to provide the charge in serial to the multiplication registers.

3. A system according to claim 1, wherein the plurality of multiplication registers are arranged to receive signal charge serially from each respective portion of the array of photosites and to simultaneously provide multiplication.

4. A system according to claim 1, wherein the multiplication registers are arranged to one side of the array of photosites.

5. A system according to claim 1, wherein the multiplication registers are arranged with some on each side of the array of photosites.

6. A system according to claim 1, wherein the multiplication registers are arranged alternatively on either side of the array of photosites.

7. A system according to claim 1, wherein the multiplication registers are arranged in pairs with each pair adjacent one another.

8. A system according to claim 1, wherein the array of photosites is arranged to have multiple rows and columns, each column arranged to receive light from the same part of the frequency spectrum, and the system arranged such that charge accumulated in the rows in respect of each portion of the frequency spectrum may be summed prior to multiplication.

9. A system according to claim 8, wherein the area array CCD is arranged to sum charge accumulated in the rows.

10. A system according to claim 8, wherein a summing region is arranged to receive and sum charge accumulated in the rows of the array of photosites.

11. A system according to claim 1, wherein the array of photosites comprises a light sensitive CCD.

12. A system according to claim 1, wherein the CCD device has a plurality of multiplication registers, each arranged to receive charge derived from a respective different portion of the frequency spectrum and arranged to as to have differing gains so as to provide a different gain to each portion of the frequency spectrum.

13. A CCD device of the type appropriate for sensing light for time resolved spectroscopy applications, comprising:
    a line array of photosites for detecting a time varying frequency spectrum for producing signal charge representative of the spectrum,
    a storage region arranged to receive the signal charge from the array of photosites, a plurality of readout registers arranged to receive charge from the storage area, and the same number of CCD multiplication registers as the plurality of readout registers each arranged to receive the signal charge from a respective one of the readout registers and to provide charge multiplication, each multiplication register being arranged to receive signal charge from a respective portion of the array of photosites corresponding to a given portion of the spectrum of wavelengths.

14. A CCD device according to claim 13, wherein the storage area is arranged to receive the signal charge in parallel from the array of photosites to provide the charge in serial to the one or more multiplication registers.

15. A CCD device according to claim 13, wherein the plurality of multiplication registers are arranged to receive signal charge serially from each respective portion of the array of photosites and to simultaneously provide multiplication.

16. A CCD device according to claim 13, wherein the multiplication registers are arranged to one side of the array of photosites.

17. A CCD device according to claim 13, wherein the multiplication registers are arranged with some on each side of the array of photosites.

18. A CCD device according to claim 13, wherein the multiplication registers are arranged alternatively on either side of the array of photosites.

19. A CCD device according to claim 13, wherein the multiplication registers are arranged in pairs with each pair adjacent one another.

20. A CCD device according to claim 13, wherein the array of photosites is arranged to have multiple rows and columns, each column arranged to receive light from the same part of the frequency spectrum, and the CCD is arranged to sum charge accumulated in the rows.

21. A CCD device according to claim 13, wherein the CCD device has a plurality of multiplication registers, each arranged to receive charge derived from a respective different portion of the frequency spectrum and arranged to as to have differing gains so as to provide a different gain to each portion of the frequency spectrum.

* * * * *